United States Patent [19]

Suda et al.

[11] Patent Number: 5,783,255
[45] Date of Patent: Jul. 21, 1998

[54] METHOD FOR PRODUCING SHAPED ARTICLE OF SILICON CARBIDE

[75] Inventors: Yoshihisa Suda, Maebashi; Yasushi Yamamoto, Takasaki, both of Japan

[73] Assignee: Mitsubishi Pencil Co., Ltd., Tokyo, Japan

[21] Appl. No.: 884,164

[22] Filed: Jun. 27, 1997

[30] Foreign Application Priority Data

Jun. 28, 1996 [JP] Japan .................................. 8-169639

[51] Int. Cl.$^6$ ...................................................... B05D 3/02
[52] U.S. Cl. .......................... 427/228; 427/227; 427/249; 427/377; 427/397.7; 427/450; 427/452
[58] Field of Search ............................. 427/228, 227, 427/249, 377, 397.7, 450, 452

*Primary Examiner*—Bernard Pianalto
*Attorney, Agent, or Firm*—Foley & Lardner

[57] ABSTRACT

A high quality shaped article of silicon carbide is efficiently produced by using a carbon substrate suitable for the production of a silicon carbide film without generating cracking or breakage. In a method of producing a shaped article of silicon carbide while using a carbonaceous material as a deposition substrate by decomposing halogenated organic silicone compound by a reduction pyrolysis at a high temperature, forming a silicon carbide film layer on a surface of the substrate by CVD and removing the carbon substrate, the carbon substrate is formed of a composite of graphite and amorphous carbon obtained by shaping and firing a mixture of a powdery graphite and an organic substance.

6 Claims, No Drawings

METHOD FOR PRODUCING SHAPED ARTICLE OF SILICON CARBIDE

BACKGROUND OF THE INVENTION

1. Field of the Invention

The present invention relates to a method suitable for efficiently producing a shaped article composed of silicon carbide film layers on an industrial scale.

2. Description of the Related Art

There are various methods in the prior art for producing silicon carbide products, used in the field of semiconductor material or other fields, while using carbon material as a substrate. Of them, a method has been generally known wherein a high purity isotropic carbon material obtained via a cutting or polishing process is used as a substrate, and after a silicon carbide film layer is formed thereon by CVD (Chemical Vapor Deposition), the carbon substrate is removed to result in a shaped article of silicon carbide.

However, according to this prior art method wherein a silicon carbide film layer is formed by CVD on a substrate of a high purity isotropic carbon material obtained by cutting a graphite block and then the carbon substrate is removed to result in a shaped article of silicon carbide, it is difficult to select a carbon substrate having a thermal expansion coefficient coinciding with that of the shaped article of silicon carbide obtained by CVD. If the thermal expansion coefficients are different from each other, the silicon carbide film layer thus obtained is liable to crack or break during the cooling process subsequent to CVD. Particularly, it is extremely difficult to industrially produce a shaped article of silicon carbide having a thickness exceeding 1 mm or having a complicated configuration. Also, there are problems in that, since the isotropic graphite material used as a substrate is weak in mechanical strength, it is necessary to use a substrate having a thickness larger than that of a silicon carbide film layer to be formed, and since the isotropic graphite material itself is not so dense and smooth, it is impossible to obtain a dense silicon carbide film.

To solve the above drawbacks, for example, in Japanese Unexamined Patent Publication (Kokai) No. 62-36089, after a silicon carbide film layer has been formed on a carbon substrate surface by CVD and the carbon substrate has been removed therefrom in dry air by incineration, a stress unbalance caused by the difference in thermal expansion coefficient is mitigated by a complicated process including the repetition of the same CVD treatment to avoid the generation of cracking or breakage.

In Japanese Unexamined Patent Publication (Kokai) No. 8-12315, a method is disclosed wherein an easily destructible porous carbon substrate having a thermal expansion coefficient suitably different from that of a silicon carbide film is used, which is deformed and destroyed, after the silicon carbide film layer has been formed thereon by CVD, by a stress unbalance due to the difference in thermal expansion coefficient during a cooling process to result in the separation of the silicon carbide film layer. However, this method is unsuitable for the production of a shaped article having a dense and smooth surface since the substrate is porous.

Also, in Japanese Unexamined Patent Publication (Kokai) No. 8-26714, a method is disclosed wherein a carbon substrate having a smooth surface and a thermal expansion coefficient suitably different from that of a silicon carbide film layer is used, which is removed from the silicon carbide film layer during a cooling process after the latter has been formed by CVD, by a stress unbalance due to the difference in thermal expansion coefficient. However, it is difficult to use this method for the production of an article having a complicated shape because the substrate must be subjected to a troublesome cutting treatment and the control of thermal expansion coefficient is difficult.

SUMMARY OF THE INVENTION

An object of the present invention is to provide a method for efficiently producing an optionally shaped article of silicon carbide, having a dense and smooth surface, by CVD.

According to the present invention, in a method for producing a shaped article of silicon carbide by decomposing a halogenated organic silicone compound by reduction pyrolysis at a high temperature, forming a silicon carbide film layer on a surface of a carbon substrate by CVD and removing the carbon substrate, a composite of graphite and amorphous carbon obtained by shaping and firing a mixture of powdery graphite and an organic substance is used as the carbon substrate, which is easily shapable and has a high strength and density, and a thermal expansion coefficient of which is easily controllable.

DESCRIPTION OF PREFERRED EMBODIMENTS

The graphite used for the present invention includes graphite whiskers, highly oriented pyrolytic graphite (HOPG), kish graphite, natural graphite and artificial graphite in a pulverized form.

The organic substance referred to in the present invention is that having a carbonization yield of 5% or more when it is fired in an inactive gas atmosphere. Examples thereof are organic resins having a three-dimentionally cross-linked structure and natural organic substances that can be carbonized in a solid phase, which are one of organic polymers, monomers or oligomers, tars, pitches, dry distillation pitches, and prepolymers of thermoplastic resin and thermoset resin, and a mixture of two kinds or more thereof.

The organic polymers include, other than thermoplastic resins and thermoset resins described later, lignin, cellulose, tragacanth gum, acacia gum, natural gum and derivatives thereof; compounds having condensed polycyclic aromatic groups in a basic structure of molecule, such as saccharide, chitin, chitosan; and indanthrene type vat dyes and intermediates thereof derived from formalin condensate of naphthalenesulfonic acid, dinitronaphthalene, pyrene, pyranthrone, violanthrone, benzoanthrone or others.

The thermoplastic resins include conventional thermoplastic resins such as polyvinyl chloride, polyacrylonitrile, polyvinylidene chloride, post-chlorinated polyvinyl chloride, polyvinyl acetate, polyvinyl alcohol, polyvinyl pyrrolidone, ethyl cellulose, carboxymethylcellulose or copolymer of polyvinyl chloride and vinyl acetate; polyphenyleneoxide; poly-para-xylene; polysulfone; polyamideimide; polybenzimidazole; and polyoxadiazole.

The thermoset resins include phenolic resin, furan resin, epoxy resin, xylene resin and copna resin, which are fluidized and cross-linked between molecules by heating to form a three-dimensional structure and cured.

The thermoplastic resins and the thermoset resins include those having a high yield of carbon residue without a special carbon precursor treatment.

The pitches include petroleum pitches, coal tar pitches, asphalts and a dry distillation pitches (products obtained by a dry distillation treatment at a temperature of 400° C. or lower, having a carbon residue yield in a range from 75 to 95%) of these pitches or hydrocarbon compounds such as synthetic pitches. The pitch is used after being subjected to an anti-carbonization treatment such as an oxidization for the purpose of cross-linking.

The carbon composite is a composite of graphite and amorphous carbon which is obtained by firing and carbonizing a mixture of the graphite and one kind of the above organic substances or two kinds or more thereof in an inactive gas atmosphere after being optionally shaped. A proper amount of graphite in the composite is in a range from 10 to 80% by weight, preferably from 25 to 50% by weight. If the graphite content in the composite is less than the lower limit of the above range, the excess amorphous carbon disables the control of graphite orientation, whereby a thermal expansion coefficient of the composite is closer to that of the amorphous carbon and smaller than that of silicon carbide and thus cracking and/or breakage may occur in the formed silicon carbide film layer when the same is cooled after the CVD treatment. Similarly, if the graphite content in the carbon composite exceeds the upper limit of the above range, the control of the thermal expansion coefficient becomes difficult which results in the generation of cracking and/or breakage in the formed silicon carbide film layer during the cooling stage after the CVD treatment. Further, if an amount of graphite is excessively large in the composite, it is impossible to obtain a product having a dense and smooth surface having a high strength, whereby a thickness of the substrate must be increased and an oxidization treatment becomes troublesome.

A method of producing a shaped article of silicon carbide according to the present invention will be described below with reference to one embodiment. First, an organic substance and graphite are well mixed by using a kneader. A shaped article having a configuration necessary as a substrate for producing a shaped article of silicon carbide according to CVD is manufactured from the mixture thus obtained. At this time, a blending ratio of graphite and organic substance and a shaping method are properly selected in view of the thermal expansion coefficient and configuration necessary as a substrate. After being subjected to a carbon precursor treatment, the resultant shaped article is heated and carbonized in an inactive atmosphere such as nitrogen or argon to more than about 800° C., preferably up to about 1500° C. The heating rate is in a range from 3 to 100° C./h, preferably from 5° to 50° C./h until the temperature reaches 500° C. If the heating rate is excessively high, there is a risk of cracking or other problems. Accordingly, the heating rate is favorably 100° C./h or less until the temperature reaches 500° C., and a carbon composite with a dense and smooth surface is obtained which also has a thermal expansion coefficient and a shape necessary as a substrate without the needing of a post treatment such as cutting and/or polishing.

The formation of silicon carbide film by CVD is carried out by placing a carbon substrate thus obtained on a support in a reaction chamber and introducing a mixed gas of hydrogen and halogenated organic silicone compound to deposit silicon carbide in a gas phase on a surface of the carbon substrate via the reduction pyrolysis of the halogenated organic compound. A source of silicon includes halogenated organic silicone compounds such as trichloromethylsilane, trichlorophenylsilane, dichloromethylsilane, dichlorodimethylsilane, chlorotrimethylsilane or dichlorosilane; mixtures of monosilane and methane; and mixtures of silicon tetrachloride and methane. Of them, trichloromethylsilane is most preferably used.

Hydrogen and a halogenated organic silicone compound are mixed so that the molar ratio thereof is in a range from about 4 to about 10, and supplied to the reaction chamber previously evacuated. If the molar ratio is out of the above range, it is impossible to obtain a dense silicon carbide film. The CVD reaction is carried out while setting a temperature of the reaction chamber in a range from 900° to 1600° C. If the reaction temperature is lower than 900° C., a formation rate of the silicon carbide film becomes too slow and the silicon carbide film thus formed becomes amorphous, while if it exceeds 1600° C., it is difficult to produce a dense silicon carbide film. A reaction time is suitably selected in accordance with types and thicknesses of silicon carbide to be formed.

The cooling rate after the CVD treatment is preferably 200° C./hour or less. If the cooling rate exceeds this value, crack may be generated in the formed silicon carbide film layer due to heat shock. In this cooling stage, a strain is generated at a boundary between the silicon carbide layer and the carbon substrate due to a difference between thermal expansions thereof, but if the thermal expansion of the composite is adjusted to be close to that of the carbon substrate, no cracking or deformation occurs. In this regard, since the carbon composite obtained by the present invention has a high strength, which enables the reduction of substrate thickness, it is possible to remove the same in a shorter time by the oxidization treatment.

The method of producing a shaped article of silicon carbide by CVD according to the present invention is characterized by the use of dense and smooth carbon substrate having a high strength and excellent in controllability of thermal expansion coefficient and shapability, which is made of a composite of graphite and amorphous carbon obtained by shaping and firing a mixture of powdery graphite and an organic substance. Accordingly, the fired substrate is usable as it is without a machining treatment such as cutting or polishing and the thermal expansion coefficients of the silicon carbide film layer and carbon substrate become generally equal to each other. Thereby, the shaped article composed of the carbon substrate integral with the silicon carbide film is obtained, which is free from the generation of strain at a boundary therebetween during the cooling process subsequent to the CVD treatment and has a dense and smooth surface. The carbon substrate is easily removable from the resultant shaped article by an oxidization treatment generally used in the prior art because it has a small thickness.

EXAMPLES

The present invention will be described in more detail with reference to Examples but is not limited thereto.

Example 1

To obtain as a product a dome-shaped article of silicon carbide having a thermal expansion coefficient of about $4.5 \times 10^{-5}/°$ C. and a thickness of 1 mm, a substrate comprised of a carbon composite was first prepared. That is, 10 parts by weight of dry distillation pitch (KH-1P available from Kureha Kagaku Kogyo K.K.) and 20 parts by weight of pulverized scale-like natural graphite (BF available from Chuetsu Kokuen Kogyosho K.K.) having an average particle size of 5 μm were added to 70% by weight of furan resin precondensate (Hitafuran VF-302 available from Hitachi Kasei K.K.), which were mixed together by a mixer and then shaped into a dome shape by an injectionmolding machine. The shaped article was removed from a mold after being preliminarily cured in a mold of a molding machine, and cured in a drier at 180° C. for three hours. The resultant product was heated in a nitrogen gas to 500° C. at a heating rate of 20° C./hour, and to 1400° C. at 100° C./hour to obtain a substrate composed of a carbon composite. The substrate was of a dome-shape having a diameter of 48 mm, a thickness of 1 mm, and a height of 9 mm. The substrate was impermeable and had a bending strength of 230 MPa.

The resultant substrate was placed on a support in a CVD reaction chamber which then was heated to 1400° C. while the interior of the system was evacuated. Thereafter, hydrogen gas was introduced into the reaction chamber so that the interior pressure is generally equal to an atmospheric pressure, and then a mixed gas of trichloromethylsilane and hydrogen was supplied at a flow rate of 2.5 l/min. The CVD reaction was continued for a predetermined time. After the completion of the CVD reaction, the substrate was cooled to a room temperature at a rate of 100° C./hour to obtain a shaped article having a 1 mm thick silicon carbide film on a surface thereof.

The carbon substrate was removed by subjecting the shaped article to an oxidizing treatment in an oxygen atmosphere in a furnace at 900° C. for two days. Thus, a dome-shaped silicon carbide shaped article, having a diameter of 50 mm, a thickness of 1 mm and a height of 10 mm, was obtained. According to an observation of the surface of the resultant silicon carbide shaped article by a scanning type electron microscope, it was found that the surface is dense and smooth, maintains the smoothness of a mold used for a shaping process and has no cracking or breakage.

Comparative Example 1

A substrate was prepared by cutting a block of isotropic graphite (IG-710U, available from Toyo Tanso K.K.). The bending strength of the isotropic graphite was 52 MPa, which is weak. Accordingly, it is necessary to increase the substrate thickness to obtain an article having a complicated configuration. Therefore, the substrate was a dome-shaped body having a thickness of 3 mm, a diameter of 48 mm and a height of 9 mm.

This substrate was placed on a support in a CVD reaction chamber which then was heated to 1400° C. while the interior of the system was being evacuated. Thereafter, hydrogen gas was introduced into the reaction chamber so that the interior pressure is generally equal to the atmospheric pressure, and then a mixed gas of trichloromethyl silane and hydrogen was supplied at a flow rate of 2.5 l/min. The CVD reaction was continued for a predetermined time. After the completion of the CVD reaction, the substrate was cooled to room temperature at a rate of 100° C./hour to obtain a shaped article having a silicon carbide film of 1 mm thick on a surface thereof.

The carbon substrate was removed by subjecting the shaped article to an oxidizing treatment in an oxygen atmosphere in a furnace at 900° C. for five days. Thus, a dome-shaped silicon carbide shaped article was obtained, having a diameter of 50 mm, a thickness of 1 mm and a height of 10 mm. Compared to Example 1, a longer time was necessary for the oxidization treatment because the thickness of the substrate is larger. According to an observation of the surface of the resultant silicon carbide shaped article by a scanning type electron microscope, it was found that there was no cracking or breakage on the surface but a fine irregularity due to the cutting operation was copied.

Example 2

To obtain as a product a disk-shaped article of silicon carbide having a thermal expansion coefficient of about $4.7 \times 10^{-5}/°$ C. and a thickness of 1 mm, a substrate comprised of a carbon composite was first prepared. That is, 5 parts by weight of dry distillation pitch (KH-1P available from Kureha Kagaku Kogyo K.K.) and 25 parts by weight of pulverized scale-like natural graphite (BF available from Chuetsu Kokuen Kogyosho K.K.) having an average particle size of 5 µm were added to 70% by weight of furan resin precondensate (Hitafuran VF-302 available from Hitachi Kasei K.K.), which were mixed together by a mixer and then shaped into a sheet form by an extrusion-molding machine and cut by a press cutter into a disk shape. The shaped article was cured in a drier at 150° C. for five hours. The resultant product was heated in a nitrogen gas to 500° C. at a heating rate of 20° C./hour, and to 1400° C. at 100° C./hour to obtain a substrate composed of a carbon composite. The substrate was of a disk shape having a diameter of 150 mm and a thickness of 0.8 mm. The substrate was impermeable and had a bending strength of 200 MPa.

The resultant substrate was placed on a support in a CVD reaction chamber which then was heated to 1300° C. while the interior of the system was evacuated. Thereafter, hydrogen gas was introduced into the reaction chamber so that the interior pressure is generally equal to an atmospheric pressure, and then a mixed gas of trichloromethylsilane and hydrogen was supplied at a flow rate of 2 l/min. The CVD reaction was continued for a predetermined time. After the completion of the CVD reaction, the substrate was cooled to a room temperature at a rate of 150° C./hour to obtain a shaped article having a 1 mm thick silicon carbide film on a surface thereof.

The carbon substrate was removed by subjecting the shaped article to an oxidizing treatment in an oxygen atmosphere in a furnace at 900° C. for two days. Thus, a disk-shaped silicon carbide shaped article was obtained, having a diameter of 150 mm and a thickness of 1 mm. According to an observation of the surface of the resultant silicon carbide shaped article by a scanning type electron microscope, it was found that the surface is dense and smooth and maintains a smoothness of a mold used for a shaping process and has no cracking or breakage.

Comparative Example 2

A substrate was prepared by cutting a block of isotropic graphite (IG-710U, available from Toyo Tanso K.K.). This substrate was placed on a support in a CVD reaction chamber which then was heated to 1300° C. while the interior of the system was being evacuated. Thereafter, hydrogen gas was introduced into the reaction chamber so that the interior pressure is generally equal to the atmospheric pressure, and then a mixed gas of trichloromethyl silane and hydrogen was supplied at a flow rate of 2 l/min. The CVD reaction was continued for a predetermined time. After the completion of the CVD reaction, the substrate was cooled at a rate of 150° C./hour, during which cracking occurred on the substrate surface. Moreover, after the cooling, the silicon carbide layer also cracked and broke. Thus, the aimed shaped article was not obtainable.

As described above, the carbon composite according to the present invention obtained from a mixture of powdery graphite and organic substance by shaping and firing the same is different from a prior art carbon substrate composed solely of amorphous carbon obtained from graphite alone or a carbonization of resin. That is, the former may have an optional thermal expansion coefficient and may be shaped to have an optional configuration necessary as a substrate by various molding machines usually used in a stage prior to the firing process. Therefore, a machining process such as cutting is unnecessary after firing the substrate, which enhances the mass-productivity as well as results in a smooth surface which is the same as the mold surface. Also, since the composite has a high mechanical strength, it is possible to reduce a thickness of the substrate made thereof. By using such a substrate, a high quality shaped article of silicon carbide having a dense and smooth surface can be efficiently produced without necessitating the troublesome processes in the prior art such as a cutting process for preparing a substrate or a removal process of the carbon substrate. Also, a shaped article having a complicated configuration is easily obtainable. Accordingly, the present invention is useful for industrially producing one-piece shaped articles of SiC for semiconductor use.

We claim:

1. A method for producing a shaped article of silicon carbide by forming a silicon carbide film layer on a surface of a carbon substrate and then removing the carbon substrate, wherein a composite of graphite and amorphous carbon obtained by firing a mixture of powdery graphite and an organic substance is used as the carbon substrate.

2. A method for producing a shaped article of silicon carbide as defined by claim 1 wherein the powdery graphite is at least one kind selected from a group consisting of kish graphite, natural graphite and artificial graphite.

3. A method for producing a shaped article of silicon carbide as defined by claim 1 wherein the organic substance is at least one kind selected from those having a yield of carbon residue of 5% or more after firing the same in an inactive gas atmosphere.

4. A method for producing a shaped article of silicon carbide as defined by claim 1 wherein the firing is carried out in an inactive gas atmosphere or a non-oxidizing atmosphere at a temperature in a range from 500° to 2500° C.

5. A method of producing a shaped article of silicon carbide, comprising the steps of:

firing a mixture of powdery graphite and an organic substance to obtain a composite of graphite and amorphous carbon;

forming a silicon carbide film layer on a surface of the composite of graphite and amorphous carbon; and removing the composite from the silicon carbide film layer to obtain the shaped article of silicon carbide.

6. A method of producing a shaped article of silicon carbide, comprising the steps of:

forming a silicon carbide film layer on a surface of a composite of graphite and amorphous carbon obtained by firing a mixture of powdery graphite and an organic substance; and removing the composite from the silicon carbide film layer to obtain the shaped article of silicon carbide.

* * * * *